United States Patent [19]

Morris et al.

[11] 4,371,882
[45] Feb. 1, 1983

[54] PROCESS FOR PREPARING ISOLATED JUNCTIONS IN THIN-FILM SEMICONDUCTORS

[75] Inventors: Hayden Morris, Washington, D.C.; Richard F. Bis, Mount Airy, Md.

[73] Assignee: The United States of America as represented by the Secretary of the Navy, Washington, D.C.

[21] Appl. No.: 926,364

[22] Filed: Jul. 20, 1978

[51] Int. Cl.³ .......................................... H01L 27/12
[52] U.S. Cl. .............................. 357/4; 357/20; 357/56
[58] Field of Search .............................. 357/4, 56, 20

[56] References Cited

U.S. PATENT DOCUMENTS 4,127,860 11/1978 Beelitz et al. .......................... 357/15

OTHER PUBLICATIONS

Sze, *Physics of Semiconductor Devices*, Wiley-Interscience, New York, 1969, pp. 567-569.

*Primary Examiner*—Martin H. Edlow
*Attorney, Agent, or Firm*—R. S. Sciascia; A. L. Branning; R. E. Bushnell

[57] ABSTRACT

A controlled environment process for making diode arrays by depositing the sublimate of a semiconductor material through an aperture of a mask placed nearby a substrate and then subjecting part of the sublimate to ion implantation. The aperture causes diffraction of the sublimate vapor stream, while the proximity of the edges of the aperature to the substrate causes the central plateau of the deposited thin-film to have a rounded rim leading to sides that taper smoothly in thickness to the substrate. Ion implantation to a controlled depth creates an isolated planar junction. Surface layers of a gold electrode running onto the substrate from different surface areas of the thin-film provide for off-mesa bonding of electrical leads.

8 Claims, 11 Drawing Figures

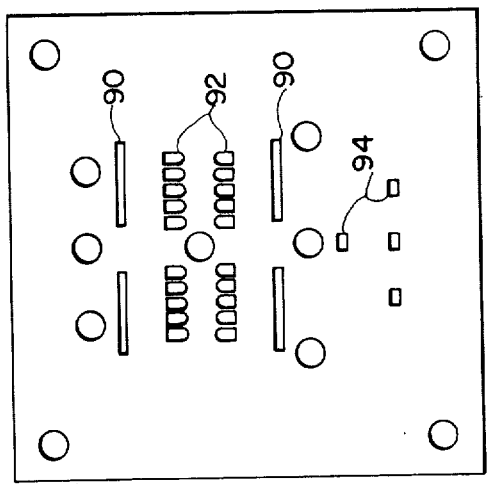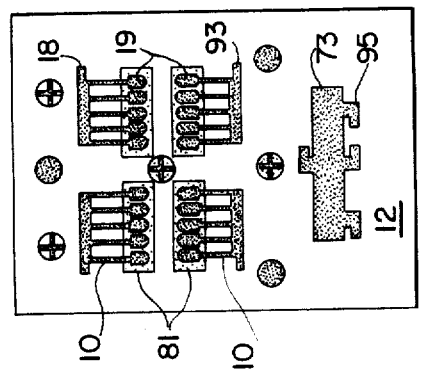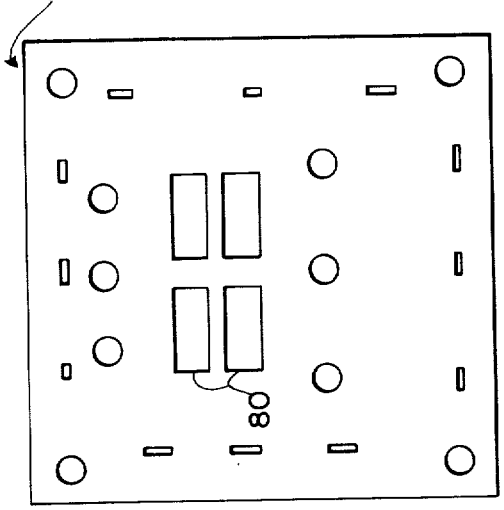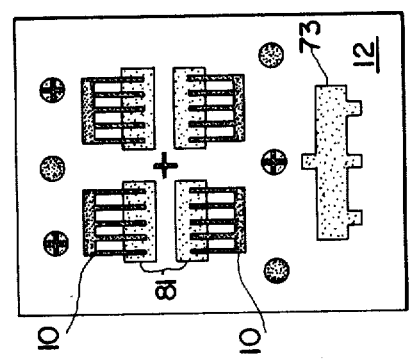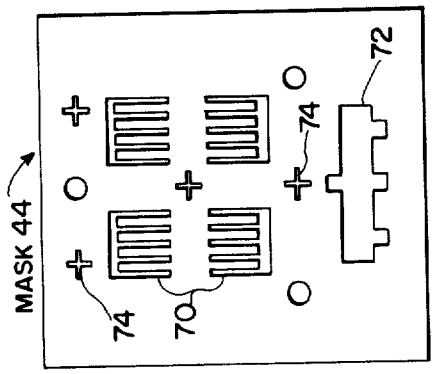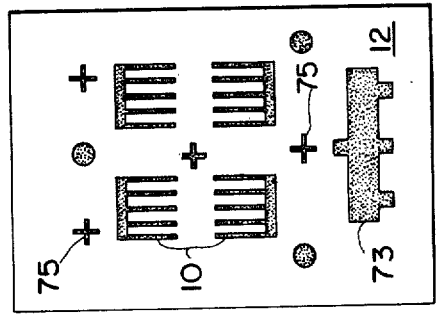

PROCESS FOR PREPARING ISOLATED JUNCTIONS IN THIN-FILM SEMICONDUCTORS

BACKGROUND OF THE INVENTION

The present invention relates to semiconductor devices having p-n type junction and to the process for making such devices. More particularly, this invention relates to the processes for vacuum deposition of epitaxial thin-films and off-mesa bonding of ohmic contact to the films.

Thin-films of lead salt alloys have been investigated intensively recently with particular attention to their photovoltaic properties. Especial attention has been paid to their possible use as detectors of infrared radiation.

The exploration of vacuum deposition techniques is quite recent and, for the benefit of those who may not be familiar with the pioneering efforts in this art, the following brief bibliography is made of record.

Properties of $PbS_{1-x}Se_x$ Epilayers Deposited Onto Pbs Substrates by Hot-Wall Epitaxy, by K. Duh and H. Preier, Journal of Vacuum Science Technology, Vol. 10, pp 1360, (1975).

PbSe Heteroepitaxy by the Hot-Wall Technique, by K. Duh and H. Preier, Thin Solid Films, Vol. 27, pp 247, (1975).

Double Heterojunction $PbS-PbS_{1-x}Se_x-PbS$ Laser Diodes With CW Operation Up to 96K, by H. Preier, M. Bleicher, W. Riedl, and H. Maier, Applied Physics Letters, Vol. 28, No. 11, (June, 1976).

PbTe and $Pb_{0.8}Sn_{0.2}Te$ Epitaxial Films on Cleaved $BaF_2$ Substrates Prepared by a Modified Hot-Wall Technique, by T. Kasai, D. W. Bassett, and J. Hornung, Journal of Applied Physics, Vol. 47, (July, 1976).

Double-Heterostructure PbS-PbSe-PbS Lasers with CW Operation Up to 120K, by H. Preier, M. Bleicher, W. Riedl, and H. Maier, Journal of Applied Physics, Vol. 47, (December, 1976); and, Growth of PbTe Films Under Near-Equilibrium, by A. Lopez-Otero, Journal of Applied Physics, Vol. 48, No. 1, January, 1977.

It is well established that single crystal films of PbS, PbSe, and related compounds hereinafter referred to as lead salt alloys, can be epitaxially grown on heated alkali halide substrates by vacuum evaporation. Anion (lead) vacancies make these crystals P-type and cation vacancies make them N-type.

Previous processes for creating planar junctions in thin-films of semiconducting materials subjected the films to photolithography and chemical etching. Under such processes the surface of a film is partially covered with a photo-resist pattern which acts as a mask and the film is subjected to ion implantation in order to form a region of the opposite type conductivity in the uncovered part of the film. After ion implantation the photo-resist pattern is removed by chemical action. Next, an insulating layer from two angstroms to five thousand angstroms thick of an electrically insulating material such as silicon dioxide is deposited upon the film. One or more windows in the insulating layer, each centered upon one of the conductivity regions of the film, are opened by further photolithographic and chemical etching steps. Then a film about six thousand angstrom units thick of an electrically conducting metal such as gold is vacuum deposited in a pattern running across the insulating layer from each of the windows. Electrical leads, 0.001 inch diameter wires, are bonded to the gold contacts, and the entire assembly is packaged in a multiple terminal flat pack.

The noun "semiconductor," as used here, indicates an electrically conducting medium with a resistivity in the range between those of metals and insulators, and in which the conduction is by electrons and holes. The adjective "epitaxial" means a smooth, continuous single-crystal film grown on a substrate, such that the crystal structure of the film corresponds to and is determined by that of the single-crystal substrate. More generally, epitaxial growth could refer to any situation in which crystallites grown onto a crystalline substrate in conformance with the structure of the substrate but, since for practice of the presently disclosed process continuous single-crystal layers of uniform thickness are preferable, the more restricted definition of the term epitaxy is used here. A "mesa" describes the topography of an electrical device that is supported by a substrate and has a flat top bounded abruptly by steep cliff-like sides that intersect the flat top at nearly right angles. In distinction, a "plateau" describes the level majority area of a structure that rises above the supporting substrate with uniformly sloping sides gradually leading from the surface of the substrate. "Off-mesa" bonding describes a structural feature of mesa type devices in which electrical leads are connected to the device at a point not on the mesa, typically on the substrate surface.

SUMMARY OF THE INVENTION

A process and the device produced by the process, for preparing diode arrays having isolated planar junctions from epitaxial thin-films of semiconducting materials. Diffraction of the vapor stream during growth of the thin-film in a vacuum deposition step, coupled with subjection of part of the thin-film to ion implantation in the next step, provides a thin-film planar structure amenable to off-mesa bonding without an intermediate step for deposition of an insulation layer and without an intermediate step for etching. In this process, a thin-film of one type conductivity is grown by vacuum deposition of the semiconducting material through a mask a few thousandths of an inch thick positioned in a vapor stream next to a substrate and onto the surface of the substrate. Influence of the edges of an aperture in the mask diffract the stream of vapor rising from the sublimed semiconductor source while the proximity of the edges of the aperture to the substrate and the sticking coefficient of the deposited material causes the sublimate to vary in thickness across its width. The sublimate, a device quality epitaxial thin-film, exhibits a cross section having a central plateau bordered by a rounded rim leading to sides that gently taper to the substrate. The shape of the aperture defines the area of the thin-film. Part of the film is then subjected to ion implantation to a controlled depth, creating a blanket-like region of second and opposite type conductivity covering the deeper volume of that area of the film subjected to implantation. The boundary between the regions of opposite type conductivity forms an isolated planar junction. After annealing, metal contacts are deposited upon the regions of different conductivity and electrical leads are then affixed to the contacts at areas remote from the film.

Accordingly, it is an object of the present invention to provide a simplified process for making planar junctions in thin films of semiconducting materials.

It is another object to provide a simplified process for depositing electrical contacts upon semiconductor devices.

It is yet another object to provide a simplified process for coupling electrical contacts to regions of opposite type conductivity in a semiconductor device.

It is still another object to provide a process for making thin-films of semiconducting materials having tapered edges.

It is still yet another object to provide a simplified process for making thin-film junction devices from semiconducting materials.

It is also an object to provide a simplified process for depositing off-mesa electrical contacts on thin-film devices.

It is a further object of this invention to provide a multi-layered semiconductor device having a simplified structure.

It is a yet further object to provide a multilayered semiconductor device having off-mesa electrical contacts.

It is a still further object to provide a single layered semiconductor device having an isolated planar junction.

It is a still yet further object to provide a semiconductor device with an isolated planar junction coupled between off-mesa electrical contacts.

It is an additional object to provide a thin-film semiconductor having no layer of electrical insulation separating the thin-film from its electrical contact.

BRIEF DESCRIPTION OF THE DRAWINGS

A more complete appreciation of this invention, its objects and many of the attendant advantages thereof, will be readily enjoyed as the same becomes better understood by reference to the following detailed description when considered in conjunction with the accompanying drawings in which like numbers indicate the same or similar components, wherein:

FIG. 2A is a top view of a mask used in the growth of thin-films according to the practice of the disclosed process.

FIG. 2B is a top view of the thin-film deposited through the mask shown in FIG. 2A.

FIG. 4A is a top view of a mask used in the ion implantation step of the disclosed process.

FIG. 4B is a top view of the thin-film shown in FIG. 2B after being subjected to ion implantation through the mask shown in FIG. 4A.

FIG. 6A is a top view of a mask used in the deposition of electrical contacts step of the disclosed process.

FIG. 6B is a top view of the thin-film shown in FIG. 4B after receiving the electrical contacts deposited through the mask shown in FIG. 6A.

DESCRIPTION OF THE PREFERRED EMBODIMENTS

Figure 1:
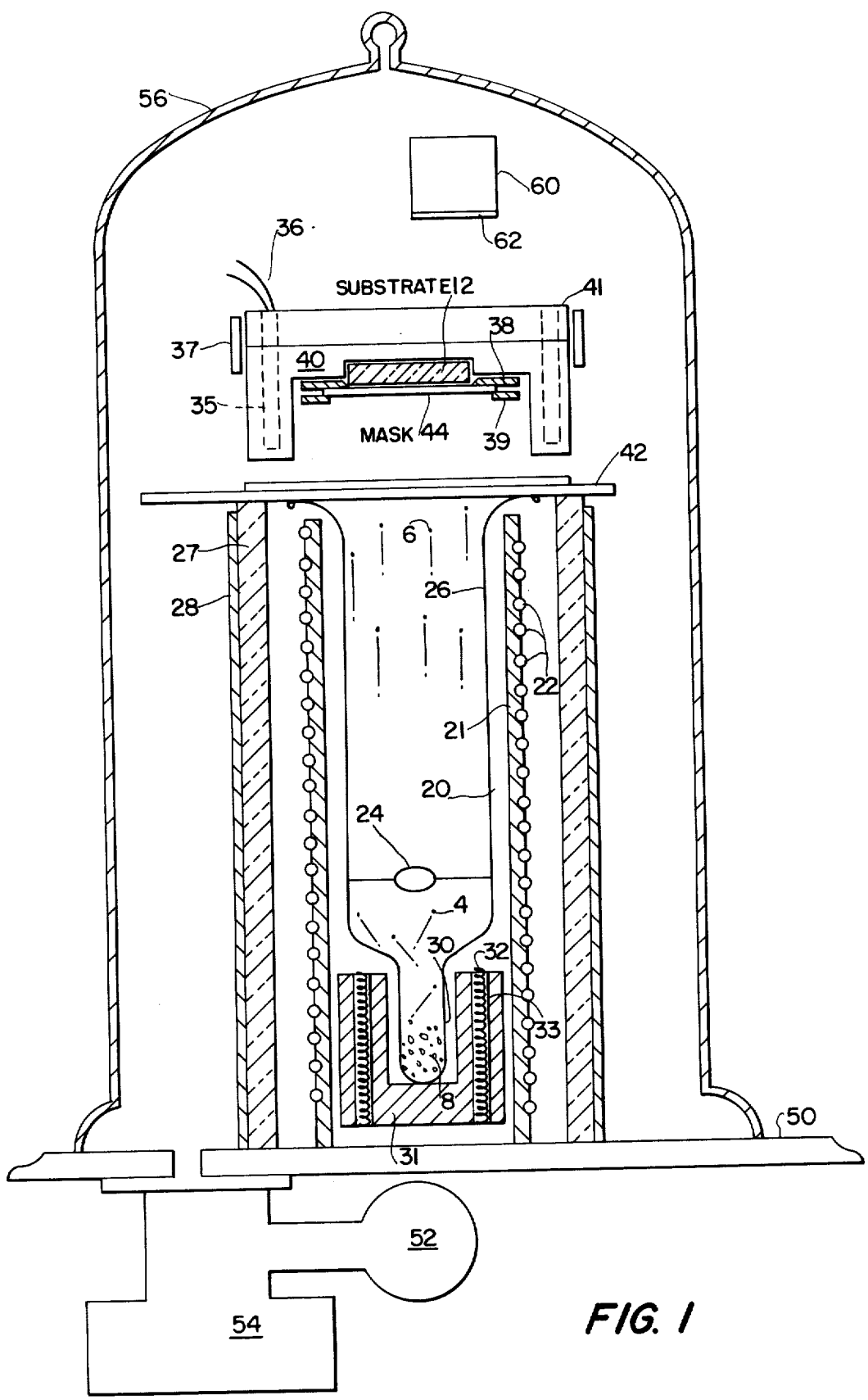
FIG. 1 shows in a cross-section front view, a sublimation apparatus in which the process of this invention may be practiced.

Refer now to the drawings, and in particular to FIG. 1, where there is shown a front sectional view of a hot wall vacuum deposition apparatus dedicated to the preparation of device quality epilayers of lead salt alloys by quasi-equilibrium growth techniques. A representative quasi-equilibrium growth technique is described in an article entitled, "Thick Epitaxial Films of $Pb_{1-x}Sn_x Te$," by R. F. Bis, J. R. Dixon, and J. R. Lowney, and published in The Journal of Vacuum Science and Technology, Vol. 9, No. 1. The apparatus shown is a conventional glass belljar 56 system with a nitrogen cold trap (not shown) and an oil diffusion vacuum pump 54. The central component of the apparatus illustrated is the narrow bottom, glass tube 20 known colloquially as an "insert". The vertical tube 20, typically fabricated from quartz glass, has a primary furnace 30 that discharges through its upper extremity into a single orifice chimney 26 of slightly wider diameter. A smaller vertical primary furnace 30, also of quartz glass, is formed by a coaxially appended (i.e., coaxially to assure a more uniform distribution of sublimate), blind tube affixed to the bottom of and discharging into the chimney 20. The primary furnace 30 is coaxially inserted into the central blind cavity of a cylindrical charge heater 31. Heater 31 is an annular block of 304 stainless steel with a number of vertical through holes 33 near its circumference. Glass tubes (not shown) with lips at one end are inserted into the circumferential holes 33 to serve as electrical insulators between the stainless steel block and the heating elements. Helically wound molybdenum wires 32, inserted through the glass tube, serve as electrical heating elements. The entire glass tube 20 is coaxially positioned inside a vertical wall heater formed by an aluminum oxide (i.e., $Al_2O_3$) sheath 21 around which a nichrome wire 22 is annularly wound. A quartz sheath 27, covered on its outside surface by an aluminum layer 28, surrounds the wall heater and serves as a heat shield. During operation, the primary furnace 20, and chimney 30 are raised to, and maintained at, the desired temperatures by the independently controlled, external heating coils 22, 32. Typically, wall heater coil 22 and furnace heater coil 32 are coupled to independent current regulated power supplies. Convection and radiant heating occurs between the primary furnace 20 and the chimney 30. A glass baffle 24 located between opposite extremities in chimney 26 restricts the molecules 4 flowing into chimney 26 so that no particle can travel from source charge 8 to substrate 12 in a straight line. Baffle 24 forces the rising particles into thermal equilibrium with the walls of chimney 26, thereby assuring that the vapor discharged from the chimney describes a plane wave transverse to the direction of motion that is very uniform in particle density and close to thermal equilibrium. Without baffle 24, neither near equilibrium nor planar deposition would be achieved. Placed directly above chimney 26 are one or more substrate heaters 40, each of which retensively holds a substrate chip 12 with one major surface exposed to the orifice of chimney 26. A commercially available thickness monitor 60 is, space permitting, located above substrate holder 40 so that a replaceable crystal face 62 is exposed to the sublimate rising from chimney 26. A shutter mechanism is located between the orifice of chimney 26 and the exposed surface of substrate chip 12. The shutter 42 is normally closed to prevent condensation of the charge materials when the furnace is not at the proper temperature. Thermocouples 64, 66, and 68 monitor the temperature of source charge 8, furnace wall 20, and substrate 12, respectively. An ion gauge 52 is used to measure the vacuum inside chamber 56 below $10^{-3}$ Torr.

Prior to operation one or more freshly cleaved (111) barium fluoride or (100) sodium chloride insulating substrates 12 are placed in substrate heater 40. A mask 44 of an inert material such as beryllium copper, with one or more apertures 70 is positioned next to the surface of substrate 12. The mask 44 is held in place above the orifice of chimney 26 between substrate 12 and shutter 42 by a two-part mask holder formed by opposite frames 38, 39 that are held together by four screws. The mask holder is bolted over a recess in the inside base of heater 40, holding substrate 12 in place while positioning mask 44 as close as possible to substrate 12. A lid 41 is bolted onto the upper base of heater 40. Cartridge heaters 36 are inserted into vertical blind holes 35 near the circumference of heater 40. A circular band heater 37 surrounds lid 41. The band heaters 36 are coupled in parallel with the band heater 37. Chamber 56 is evacuated to a pressure on the order of $10^{-6}$ Torr (i.e., approximately $1.3 \cdot 10^{-4}$ Pa), although only a vacuum of better than $10^{-5}$ Torr is necessary. The semiconductor source charge 8 and chimney 26 are independently heated to, and maintained at their operating temperatures by their respective heaters 32, 22. Source charge 8 is heated to a temperature between 600° C. and 750° C., typically about 675° C. Substrate 12 is heated to a temperature between 250° and 500° C., typically 325° C. The wall heater maintains the thermal gradient between the source charge 8 and the substrate 12. Shutter 42 is opened, and a p-type conductivity film 14 (not shown in FIG. 1) of the sublimed source charge material 8 is deposited to a thickness of a few microns on the substrate 12. When the desired thickness, as measured by the change in resistivity of the replaceable crystal face 62 of thickness monitor 60, is obtained, shutter 42 is closed.

Refer now to FIG. 2A where a top view illustrates typical apertures in mask 44. Four apertures 70, each with five parallel fingers about 0.170 inches long and 0.010 inches wide, are spaced apart by 0.040 inches. A shorting bar pattern 0.030 inches wide runs along the ends of each group of five fingers. An aperture 72 for a Hall measurement pattern is towards the bottom of mask 44. FIG. 2B is a top view of substrate 12 after deposition through the apertures 70, 72 of p-type conductivity thin-films 10, 73 respectively. Registration marks 75, deposited through apertures 74, facilitate alignment of substrate 12 with respect to other masks used in subsequent fabrication steps. A discussion on masks, their manufacture and their use in the growth of thin-films, appears in a paper written by A. E. Hill and P. A. Rigby, titled "The Precision Manufacture and Registration of Masks for Vacuum Evaporation", and published in the "Journal of Scientific Instruments" (Journal of Physics E) Series 2, Volume 2, page 1085, in 1969.

Figure 3:
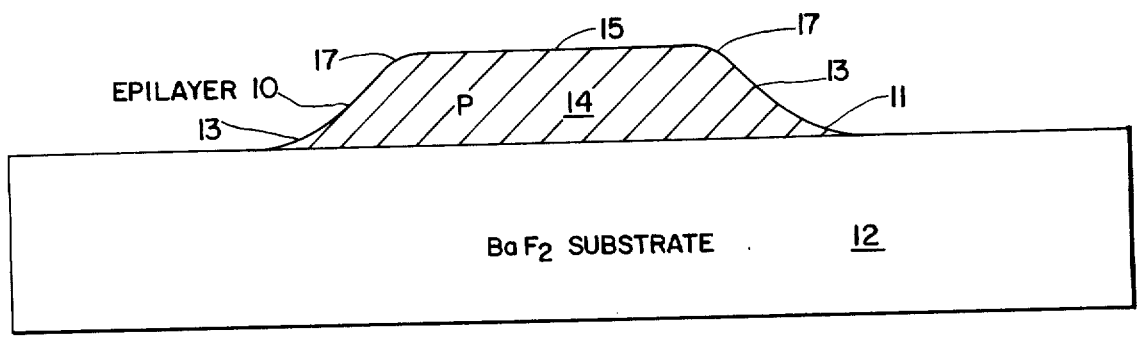
FIG. 3 shows in a partial cross-sectional side view, a thin-film prepared according to the disclosed process.

FIG. 3 is a side cross-sectional view taken along the length of one finger and across the width of the adjoining shorting bar of a newly deposited epitaxial layer epilayer 10 having a p-type conductivity. The proximity of mask 44 to the surface of substrate 12, and the diffraction of the vapor stream caused by the apertures 70, 72, produce a thin-film 10 having a topography that includes a central plateau 15 bordered by rounded rims 17 and sides 13 of tapered thickness. The foot 11 of plateau 15 lies on the surface of substrate 12. Insulating substrate 12 is a base providing support for epilayer 10.

After cooling, the newly deposited thin-film 10 and substrate 12 are removed from vacuum chamber 56 and exposed to ion implantation through the mask 45 shown in FIG. 4A. An early discussion of ion implantation appears in U.S. Pat. No. 3,520,741, issued in July, 1970 to R. G. Mankarious for a Method of Simultaneous Epitaxial Growth and Ion Implantation. A more recent discussion appears in "Ion Implantation of $Pb_{0.8} Sn_{0.2}$ Te," a paper written by R. F. Bis and Bland Houston, and published in the IEEE Transactions on Nuclear Science, page 1546, Volume NS-23, Number 6, in December, 1976. Each of the four apertures 80 exposes 0.080 inches of the distal ends of each group of five fingers to an ion implantation beam. The ion implantation beam places impurities through the exposed surfaces of each of the deposited thin-films to a controlled depth, creating a n-type region over the 0.080 inch length of each finger. Preferably, the thin-films are annealed in a vacuum after implantation of the ions. The implanted base thin-films 10 are shown in FIG. 4B. The implanted regions 81 of substrate 12 appear slightly darker than the surrounding areas of the surface of substrate 12. It is possible to limit the implantation of ions in substrate 12 by placing both masks 44 and 45 between thin-films 10 and the ion beam. The presence of an ion implanted zone of substrate 12 adjoining thin-film 14 however, has had no observable effect upon the performance of the thin-film device.

Figure 5:
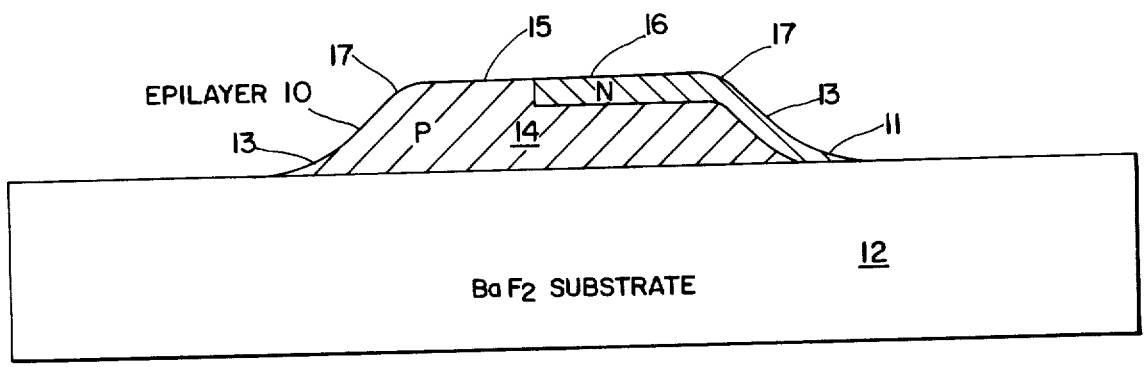
FIG. 5 shows in a partial cross-sectional side view, a thin-film into which a region of opposite type conductivity has been disposed.

FIG. 5, a side cross-sectional view along the length of one finger of epilayer 10, illustrates the effect of ion implantation to a controlled depth. Since the sides 13 of epilayer 10 are tapered in thickness, ion implantation is total in the epilayer in the vicinity of substrate 12 (i.e., at the foot 11 of the plateau 15). The result is a n-type layer 16 extending over the terminal 0.080 inches of the distal part of epilayer 10. The boundary between p-type region 14 and n-type region 16 defines a planar junction.

Figure 7:
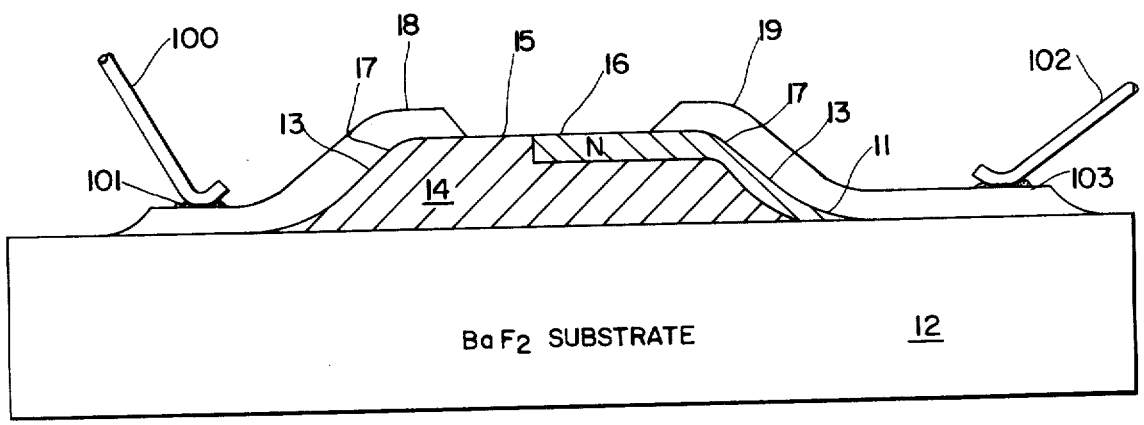
FIG. 7 shows in a partial cross-sectional side view, the thin-film shown in FIG. 2B onto which a pair off-mesa electrical contacts have been disposed.

The ion implanted thin-films 10 are placed in a second vacuum chamber similar to that illustrated by FIG. 1 in order to deposit single layers of an electrically conducting material such as gold, silver, or aluminum to serve as electrical contacts to the base films 14 and the implanted regions 16. The apertures 90, 92, 94 of mask 46, shown in FIG. 6A, define the areas of thin-films 14, 73 upon which gold electrical contacts 18, 19, 95 respectively, shown in FIG. 6B, are deposited. Turn now to FIG. 7 where a side cross-sectional view along the length of one of the fingers of thin-film 14 shows gold electrical contacts 18, 19 separately deposited upon the p and n-type conductivity regions 14, 16 respectively. The electrical contacts 18, 19 run from the plateau 15, over the rounded rims 17, along the tapered sides 13, and onto the surface of substrate 12. No layer of electrical insulation separates the regions of different type conductivity 14, 16 from their overlying electrical contacts 18, 19. Electrical leads 100, 102 (e.g., 0.001 inch diameter aluminum wires) may be connected off-mesa (i.e., off the plateau) to electrical contacts 18, 19 respectively, by compression bonding, ultrasonic bonding, silver paint, or silver epoxy 101, 103. In one embodiment the gold electrical contacts had a thickness of about 6,000 angstrom units, covered 0.050 inch lengths of regions 14, 16, and extended onto substrate 12 to a point 0.020 inches beyond the end of the thin-film. Electrical contact 19 does not create a short between regions 14 and 16 because the penetration of the ion implantation is total at the tapered edges 13 in the vicinity of substrate 12. The rounded rim 17 bonding plateau 15 and the tapered edge 13 eliminates the possibility of a cleavage or fissure occurring in electrical contacts 18, 19 at the edge of plateau 15, that could possibly cause either a high resistance or open circuit between regions 14, 16 and electrical leads 100, 102. The completed unit is suitable for package in a multi-lead flat pack.

Figure 8:
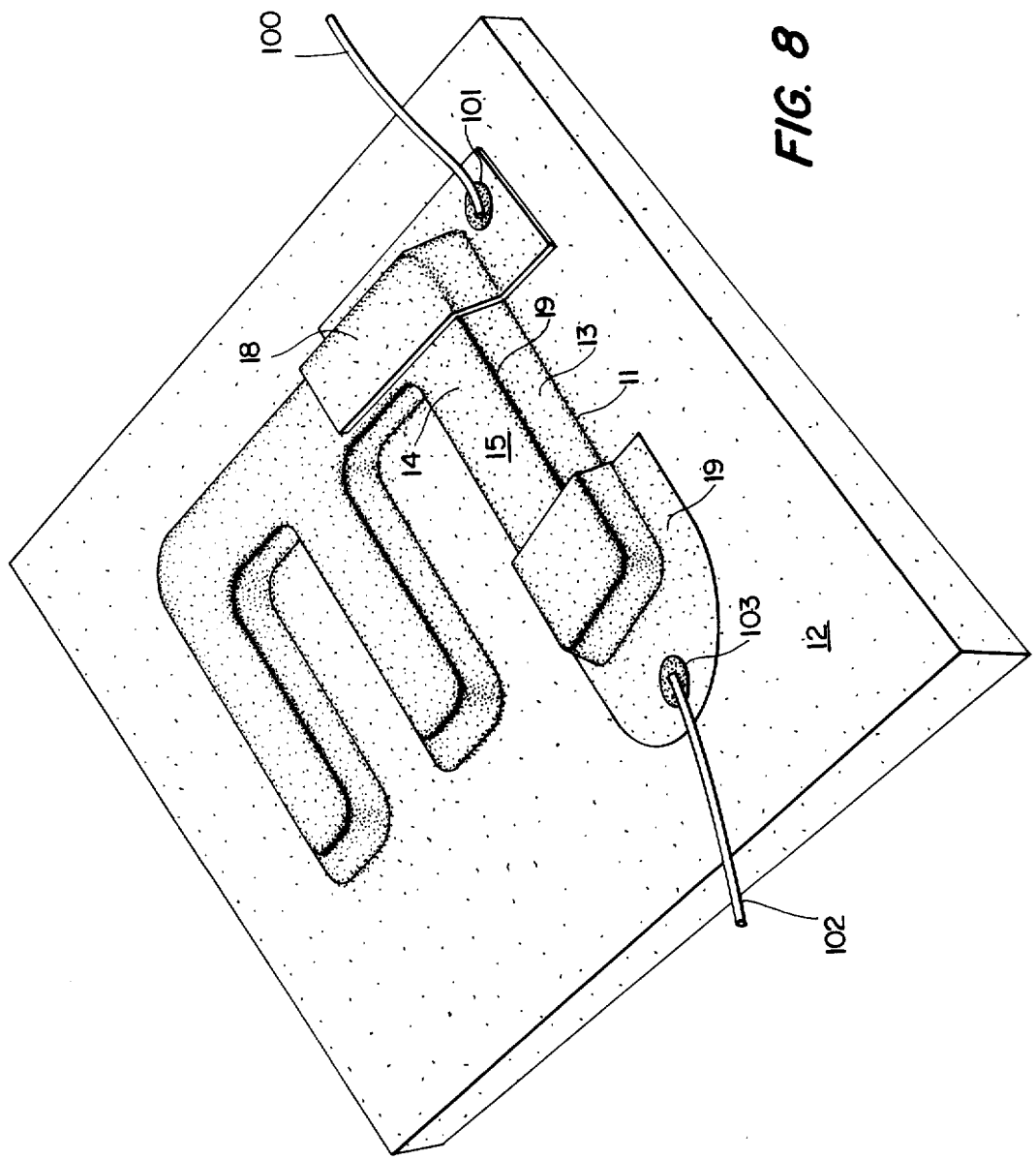
FIG. 8 is an oblique view of a thin-film device into which a region of opposite type conductivity has been disposed and onto which a off-mesa electrical contacts have been disposed.

FIG. 8 presents an oblique view of a completed article, showing the features of its topography, the placement and contours of electrical contacts 18, 19, and the off-mesa attachment of leads 100 and 102.

Although tne newly deposited thin-film 14 is described as having a p-type conductivity and the region 16 created by ion implantation is described as having a n-type conductivity, these conductivities depend respectively upon the stoichiometry of source charge 8 and the identity of the ions in the implantation beam and may be changed. Ions suitable for creating a n-type conductivity by implantation include lead, tin, indium, iodine, silicon, and germanium while sulfur, seleuium, tellerium, sodium, potassium, and oxygen ions are among those suitable for creating a p-type conductivity region 16 in a n-type conductivity thin-film 14.

The general nature of the invention having been set forth, the following illustrative example is presented as a typical embodiment. It is understood that the invention is not limited to this example, but is susceptible to various modifications that will be recognized by one of ordinary skill in the arts. The values of the dimensions given in the example for the thin-films grown were obtained either by measurement with a Sloan instrument or by microscopic examination. The Sloan instrument uses a scribe as a finger which is drawn across the surface of a feature such as a section of a thin-film, and provides a two dimension record of the travel of the scribe.

EXAMPLE

An epitaxial layer of lead-tin telluride was grown upon a heated barium fluoride substrate according to the disclosed process. A beryllium copper mask about six thousandths of an inch thick was positioned next to the surface of the substrate. The apertures in the mask included four arrays of five parallel fingers extending from a shorting bar, one Hall measurement pattern, and seven registration marks. Each finger aperture of the mask was seventeen hundredths of an inch long and one hundredth of an inch wide. Adjacent finger apertures were separated by a space of four hundredths of an inch.

The thin-film grown had a thickness of about sixty thousand angstrom units. The width of one finger was examined. The central plateau 15 of that finger had a width of about sixty-nine ten thousandths of an inch; the base width (i.e., the dimension projected onto the surface of substrate 12), of one side, including the rounded edge, was eleven ten thousandths of an inch while the base width of the opposite side was fourteen ten thousandths of an inch. The total width of the exemplary finger was almost ninety-five ten thousandths of an inch.

In the description of this process it is stated that mask 44 is placed as close as possible to the surface of substrate 12 upon which the semiconductor thin-film is to be grown. In the example it is stated that the mask used was six thousandths of an inch thick. Accordingly, in the example the edge of the aperture closest to the semiconductor source charge is about six thousandths of an inch (i.e., 152.4 microns) from the surface of the substrate. The thickness of the thin-film grown in the example, six microns (i.e., 60,000 angstrom units) upon completion of the film's growth, the film is framed by, but does not extend through, the defining aperture. The use of mask 46 for deposition of the gold electrical contacts does not constitute a part of this invention.

It is apparent from the details of the description that the disclosed process provides a simplified method for making thin-film semiconductor devices. In particular, the disclosed process eliminates the necessity of performing chemical etching and photolighographic steps, as well as the attendant exposure of the thin-film to the risk of damage inherent in those steps. Additionally, this process eliminates the step of depositing a silicon dioxide layer upon the thin-film in order to insulate the film from its electrical contacts. The elimination of these steps provides a semiconductor device having an improved (e.g., no cleavage or fissure in the gold electrical contact occurs at the edge of the semiconductor layer) and simplified (e.g., no silicon dioxide layer separates the semiconductor layer from the gold electrical contact layer) structure. Furthermore, as this process has fewer steps, it provides, in production quantities, a lower number of rejects. This process can be practiced with materials that evaporate as well as with those that sublime. Other materials that can be deposited by sublimitation include chromium, molybdenum, lead, vanadium, iron and silicon.

What is claimed and desired to be secured by Letters Patent of the United States is:

1. A thin-film device, comprising:
   an electrically insulating substrate;
   a layer of a semiconductor material comprising a plurality of fingers each having a jointed end with a first type conductivity separated by a predominately planar junction from a distal end with a second and opposite type conductivity and a shorting section abutting each joined end;
   a plateau central to the layer describing a plane substantially parallel to the surface;
   a rounded rim bordering the plateau; and
   sloping sides joining the rounded rim with the surface of the substrate.

2. A thin-film device, comprising:
   an electrically insulating, crystalline substrate;
   an epitaxial layer of a semiconducting material deposited on one surface of the substrate;
   a plateau central to the layer describing a plane parallel to the surface;
   a rounded rim bordering the plateau;
   sloping sides joining the rounded rim with the surface of the substrate;
   a junction in the layer between regions of a first and a second type conductivity, defining adjoining planes parallel to the plateau and the sides, and extending between the plateau and the substrate.

3. The thin-film device set forth in claim 2, further comprising:
   a plurality of electrical contacts spaced apart opposite the junction, each contact extending between the plateau and the surface.

4. The thin-film device set forth in claim 3, wherein each contact is continuously contiguous with the plateau, the surface, the intermediate rim and sides.

5. The thin-film device set forth in claim 2, further comprising the sloping sides describing an angle with the substrate of about twelve degrees.

6. The thin-film device set forth in claims 2 or 3, further comprised of the layer deposited upon one surface of the substrate by vacuum deposition of the material through a mask having an aperture with edges on opposed surfaces disposed between the substrate and an all chemically reacted source of the material.

7. The thin-film device set forth in claim 6 wherein the edge of the aperture nearest the source is at a distance between one thousandth and ten thousandths of an inch from the substrate.

8. A thin-film device, comprising:
a crystalline substrate;
a thin-film epitaxial layer of a semiconducting material having a first type conductivity deposited upon one surface of the substrate by diffraction of a vapor stream of the material passing through an aperture having edges on its opposed surfaces disposed between the surface of the substrate and a source of the material during vacuum deposition of the source;
a region of a second and opposite type conductivity disposed into at least one side of the layer;
a plateau central to the layer describing a plane parallel to the surface;
a rounded rim bordering the plateau;
sloping sides joining the rounded rim with the surface of the substrate to describe an included angle;
the region including at least one of the sloping sides and an adjoining area of the plateau; and
a fissure-free electrical contact traversing a section of the rounded rim bordering the area of the plateau having the second and opposite type conductivity.

* * * * *